United States Patent [19]
Cozar et al.

[11] Patent Number: 5,888,848
[45] Date of Patent: Mar. 30, 1999

[54] CONNECTION LEADS FOR AN ELECTRONIC COMPONENT

[75] Inventors: Ricardo Cozar, La Fermete; Jean-Pierre Reyal, Eragny, both of France

[73] Assignee: Imphy S.A. (Societe Anonyme), Puteaux, France

[21] Appl. No.: 5,775

[22] Filed: Jan. 12, 1998

[30] Foreign Application Priority Data

Apr. 27, 1995 [FR] France ................................. 9505015

[51] Int. Cl.⁶ .......................... H01L 21/44; H01L 21/48; H01L 21/50
[52] U.S. Cl. .......................... 438/123; 438/106; 438/121
[58] Field of Search ................... 438/123, 106, 438/121

[56] References Cited

U.S. PATENT DOCUMENTS

| | | | |
|---|---|---|---|
| 4,439,247 | 3/1984 | Arita et al. . | |
| 5,026,435 | 6/1991 | Nakamura et al. . | |
| 5,246,511 | 9/1993 | Nakamura et al. . | |
| 5,362,679 | 11/1994 | Wakefield | 438/123 |
| 5,424,030 | 6/1995 | Takahashi . | |
| 5,428,889 | 7/1995 | Mita et al. | 438/123 |
| 5,744,868 | 4/1998 | Cozar et al. . | |

FOREIGN PATENT DOCUMENTS

| | | |
|---|---|---|
| 0 448 266 | 9/1991 | European Pat. Off. . |
| 42 30 030 | 3/1993 | Germany . |

OTHER PUBLICATIONS

Chemical Abstracts, vol. 84, No. 22, May 31, 1976.
Patent Abstracts of Japan, vol. 002, No. 089, Jul. 21, 1978 and JP–A–53 048917, May 2, 1978.
Patent Abstracts of Japan, vol. 015, No. 461, Nov. 22, 1991 and JP–A–03 197641, Aug. 29, 1991.
Patent Abstracts of Japan, vol. 010, No. 107, Apr. 22, 1986 and JP–A–60 238446, Nov. 27, 1985.
Chemical Abstracts, vol. 76, No. 12, Mar. 20, 1972 and Abstract No. 62583, U. Ende p. 207.
Chemical Abstracts, vol. 89, No. 22, Nov. 27, 1978 and Abstract No. 183442, p. 207.
Patent Abstracts of Japan, vol. 95, No. 7, Aug. 31, 1995 and JP–A–07 102324, Apr. 18, 1995.

*Primary Examiner*—Kevin M. Picardat
*Assistant Examiner*—Deven Collins
*Attorney, Agent, or Firm*—Oblon, Spivak, McClelland, Maier & Neustadt, P.C.

[57] ABSTRACT

Martensitic or austenitic structural-hardening conductive alloy connection leads. Electronic component and fabrication process.

16 Claims, No Drawings

CONNECTION LEADS FOR AN ELECTRONIC COMPONENT

BACKGROUND OF THE INVENTION

1. Field of the Invention

The present invention relates to connection leads for electronic components. More particularly, the invention relates to connection leads made from a structural-hardening conductive alloy, electronic components comprising such leads and a method of manufacturing such leads.

2. Prior Art

Certain electronic components, especially integrated circuits and active discrete components, consist of an electronic device, for example made of semiconducting material, connected by very fine wires to connection leads, the whole assembly being encased in a protective package made of synthetic material. The connection leads, which emerge on the outside of the package, comprise a part called "internal connection leads", this part being located within the package, and a part called "external connection leads", located outside the package. The external connection leads are intended to connect the electronic component to the printed circuit within which it is incorporated. The connection leads are made either of an alloy of the iron-nickel type having approximately 42% of nickel or of a copper-based alloy. The choice of the alloy used is made, especially, depending on the electrical and mechanical properties desired.

In order to fabricate the connection leads, an alloy strip is taken from which a lead frame is cut, either by a mechanical means or by a chemical means, this lead frame consisting of a plurality of internal and external connection leads connected together by strips of metal and arranged with respect to one another as they will be when they are integrated into the electronic component. The lead frame is then degreased, descaled, rinsed and coated with a galvanic deposition of nickel and then of a precious metal or of copper, before assembly and interconnection with the device made of, e.g., semiconducting material which is soldered or bonded to a metal piece located at the center of the internal connection leads. Next, the assembly thus obtained is overmolded by injecting a polymer under pressure and the external connection leads are isolated from one another by cutting. The external connection leads are then descaled, tinned and then shaped by bending. The electronic component is said to be "encapsulated in a plastic package".

This encapsulation process is also used for passive components, such as, for example, inductors, resistive networks, delay lines or capacitors.

In order to connect the electronic devices, it is also possible to use the process commonly called "tape automated bonding" or TAB, in which the lead frame is fabricated from a polyimide film coated with a copper alloy deposited by galvanic deposition or by colaminating.

These two processes have drawbacks resulting from the inadequacy of the mechanical properties of the alloys used. In particular, with the first process, which uses rolled foils, it is difficult to reduce the thickness of the connection leads below 0.1 mm, which limits the miniaturization of the components.

With the second process, which uses depositions on polyimide film, the length of the internal connection leads cannot be increased as much as would be desirable for facilitating mounting.

In both cases, no known means exists for satisfying both the fabrication constraints, especially the formability, and the requirements of mechanical strength of the connection leads. As a result, for example, it is difficult to fabricate integrated circuits having a thickness of less than 1 mm, while for some applications, it would be desirable to be able to fabricate integrated circuits having a thickness of less than 0.5 mm with good fabrication yields.

In addition, the electronic components, consisting of a device encapsulated in packages having a thickness of less than 0.5 mm, are very difficult to handle because of the very great fragility of the external connection leads. In order to improve the mechanical strength of leads, it was proposed in U.S. Pat. No. 5,246,511 to use a high-strength material having a duplex-structure composed of a reverse-transformed austenite phase and a martensite phase. The material is hardened by cold-rolling before use. Unfortunately, the mechanical strength of this material is not enough to be used to fabricate integrated circuits with very low thickness.

SUMMARY OF THE INVENTION

The object of the present invention is to remedy this drawback by proposing a means for fabricating connection leads having a thickness of less than 0.1 mm for an electronic component, and having a mechanical strength sufficient to allow easy handling of the electronic component and its mounting on a printed circuit.

The above object is accomplished by the use of a structural-hardening conductive alloy in the fabrication of connection leads of an electronic component. Preferably, the electronic device comprises a plurality of connection leads and an outer case, and the structural-hardening alloy is preferably cut before structural-hardening treatment. This cutting, intended to obtain a lead frame, may be carried out either by mechanical cutting, by chemical cutting, etc.

The structural-hardening conductive alloy useful in the present invention is, for example, an alloy of the martensitic type, the chemical composition of which comprises, by weight:

$0\% \leq Co \leq 30\%$ $9\% \leq Ni \leq 21\%$ $5\% \leq Mo \leq 12\%$ $0.1\% \leq Al+Ti \leq 9\%$ $0\% \leq Nb \leq 1\%$ $0\% \leq C \leq 0.15\%$ $0\% \leq Mn \leq 5\%$ $0\% \leq Cr \leq 13\%$ optionally at least one element taken from W, V and Be each in amounts of less than 0.1% and, optionally, copper in an amount of less than 0.3%, the balance being iron and inevitable impurities resulting from smelting.

Preferably, the chemical composition of the structural-hardening conductive alloy useful herein is as above but such that:

$8\% \leq Co \leq 10\%$ $17\% \leq Ni \leq 19\%$ $5\% \leq Mo \leq 6\%$ $0.3\% \leq Ti \leq 0.7\%$ The structural-hardening conductive alloy can also be an alloy of the austenitic type, the chemical composition of which comprises, by weight:

$35\% \leq Co \leq 55\%$ $15\% \leq Cr \leq 25\%$ $10\% \leq Ni \leq 35\%$ $0\% \leq Fe \leq 20\%$ $0\% \leq Mo \leq 10\%$ $0\% \leq W \leq 15\%$ $0\% \leq Mn2\%$ $0\% \leq C \leq 0.15\%$ the balance being impurities resulting from the smelting.

Preferably, the chemical composition of the structural-hardening conductive alloy of the austenitic type is as above but such that:

$39\% \leq Co \leq 41\%$ $15\% \leq Fe \leq 20\%$ $15\% \leq Ni \leq 17\%$ $6\% \leq Mo \leq 8\%$ $19\% \leq Cr \leq 21\%$ The invention also relates to an electronic component, preferably of the type comprising a device made of semiconducting material, a plurality of connection leads and an outer case, the connection leads of which are made of a structural-hardening conductive alloy, for example of the martensitic type, the chemical composition of which preferably comprises, by weight:

$0\% \leq Co \leq 30\%$ $9\% \leq Ni \leq 21\%$ $5\% \leq Mo \leq 12k$ $0.1\% \leq Al+Ti \leq 9\%$ $0\% \leq C \leq 0.15\%$ $0\% \leq Mn \leq 5\%$ $0\% \leq Cr \leq 13\%$ optionally, at least one element taken from W, V and Be each in amounts of less than 0.1% and, optionally, copper in an amount of less than 0.3%, the balance being iron and impurities resulting from the smelting.

More preferably, the chemical composition of the structural-hardening conductive alloy of the martensitic type is as above but such that:

$8\% \leq Co \leq 10\%$ $17\% \leq Ni \leq 19\%$ $5\% \leq Mo \leq 6\%$ $0.3\% \leq Ti \leq 0.7\%$ The electronic component according to the invention may also comprise connection leads made of structural-hardening austenitic alloy, the chemical composition of which preferably comprises, by weight:

$35\% \leq Co \leq 55\%$ $15\% \leq Cr \leq 25\%$ $10\% \leq Ni \leq 35\%$ $0\% \leq Fe \leq 20\%$ $0\% \leq Mo \leq 10\%$ $0\% \leq W \leq 15\%$ $0\% \leq Mn \leq 2\%$ $0\% \leq C \leq 0.15\%$ the balance being impurities resulting from the smelting.

More preferably, the chemical composition of the structural-hardening conductive alloy is as above but such that:

$39\% \leq Co \leq 41\%$ $15\% \leq Fe \leq 20\%$ $15\% \leq Ni \leq 17\%$ $6\% \leq Mo \leq 8\%$ $19\% \leq Cr \leq 21\%$ The connection leads of the electronic component according to the invention and those manufactured according to the invention method preferably have a thickness of less than 0.1 mm including 0.09, 0.08, 0.07, 0.06, 0.05, 0.04, 0.03, 0.02, 0.01, 0.008, 0.005, 0.003, 0.001 mm, etc., including all values and subranges therebetween.

The invention also relates to a method for fabricating an electronic component preferably of the type comprising an electronic device, a plurality of connection leads and an outer case, in which the above alloys are used and in which:

a lead frame is fabricated from a structural-hardening conductive alloy, before structural hardening, the internal and/or external connection leads are optionally formed (mechanically shaped), a secondary-hardening heat treatment is carried out, the electronic device is fixed to the internal connection leads, optional metal deposition on said internal and/or external leads prior to or after secondary hardening an outer case is produced by overmolding, and the external connection leads are cut, optional metal deposition on said external leads.

The process for fabricating an electronic component according to the invention may also be such that:

a lead frame is fabricated, made of a structural-hardening conductive alloy before structural hardening, the electronic device is fixed to the lead frame of the internal connection leads, the outer case is produced by overmolding, the external connection leads are cut, the external connection leads are optionally formed and/or metal-deposited, a localized secondary-hardening heat treatment is carried out on the external connection leads, and optional metal deposition on said external leads.

Finally, the subject of the invention is a process for fabricating an electronic component by tape automated bonding which uses a tape comprising at least one layer of one of the above-described structural-hardening conductive alloys and, optionally, a layer of polymer for fabrication of the lead frames.

DESCRIPTION OF THE PREFERRED EMBODIMENTS

The invention will now be described more precisely, but not in any limiting way, by taking as example of an electronic component a microprocessor consisting of a doped-silicon chip on which the circuits of the microprocessor are implanted.

In a first embodiment, the circuits of the microprocessor are connected to internal connection leads by means of gold or aluminum wires of approximately 30 $\mu$m in diameter. The whole assembly is encapsulated in an outer case consisting of a package made of polymer of the epoxy type filled with particles of silica or of other insulating materials. The external connection leads emerge outside the package and are shaped so as to be able to be soldered to a printed circuit.

The internal and external connection leads are made of a structural-hardening martensitic conductive alloy having a yield strength greater than 1400 MPa after structural hardening, the chemical composition of which, by weight, comprises:

$0\% \leq Co \leq 30\%$ $9\% \leq Ni \leq 21\%$ $5\% \leq Mo \leq 12\%$ 0.1% ≤ Al+Ti ≤ 9%
0% ≤ Nb ≤ 1%
0% ≤ C ≤ 0.15%
0% ≤ Mn ≤ 5%
0% ≤ Cr ≤ 13% optionally, at least on element taken from W, V and Be each in amounts of less than 0.1% and, optionally, copper in an amount of less than 0.3%, the balance being iron and impurities resulting from the smelting.

Preferably, the chemical composition of the structural-hardening conductive alloy is as above but such that:

8% ≤ Co ≤ 10%
17% ≤ Ni ≤ 19%
5% ≤ Mo ≤ 6%
0.3% ≤ Ti ≤ 0.7%

With this preferred chemical composition, the alloy has an expansion coefficient of between $8 \times 10^{-6}/K$ and $12 \times 10^{-6}/K$, which ensures that there is good compatibility between the expansion coefficients of the silicon, the polymer and the connection leads.

The connection leads are, optionally, coated with a galvanic deposition of nickel and then gold, silver or palladium, and their external parts may be tinned or include a deposition of solder.

In order to fabricate the electronic component, a foil, preferably made of the above-described martensitic or austenitic structural-hardening conductive alloy having a thickness of less than 0.1 mm and preferably of between 30 $\mu$m and 80 $\mu$m, softened by heat treatment at a temperature of between 750° C. and 1000° C. in order to have a yield strength of less 1100 MPa, is taken and a lead frame is fabricated The lead frame, known per se, consists of a rectangular plate comprising a plurality of cutouts, each intended to receive a silicon chip. Each cutout comprises a plurality of lamellae attached at one of their ends to the plate and arranged, with respect to one another, in a generally radiating manner and converging on the same area in which there is a small rectangular plate on which the silicon chip will be implanted. Each of the lamellae is intended to form a connection lead. That part of a lamella located near the area of convergence is intended to form an internal connection lead and the other part of the lamella is intended to form an external connection lead. The cutouts are produced by mechanical cutting, by chemical cutting, etc.

In general, the cutouts are made in the foil and, after cutting, preferably one, some or all of anodic or cathodic degreasing, chemical descaling and rinsing are carried out in succession. There follows, optionally, a galvanic deposition of nickel and then, optionally, a galvanic deposition either of gold or of silver or of copper or of palladium. Finally, the rectangular lead frames, typically capable of receiving from five to twelve silicon chips, are cut out.

Once the lead frames have been cut out, the connection leads are formed by bending or stamping and a hardening heat treatment is carried out, for example by heating between 400° C. and 550° C. for from 1 to 5 hours, preferably in an inert atmosphere. The heat treatment may also consist of heating to a temperature of about 700° C. for from a few seconds to a few minutes. The leads may also be formed during or after the cutting-out operation or not at all, the heat treatment then preferably being carried out after the cutting-out/optional forming operation.

Next, a silicon chip on which a circuit is implanted, which is soldered or bonded, is placed on each of the small rectangular plates located at the center of each of the areas of convergence of the lamellae. Next, the circuit is connected to the lamellae by gold or aluminum wires.

Once the silicon chips have been connected to the lamellae, the outer case for each of the chips is produced by overmolding, for example, by injecting a polymer under pressure, and the whole assembly is cured between, e.g., 170° C. and 250° C. for from, e.g., 4 to 16 hours depending on the polymer.

When the encapsulation has been completed, the lead frame is cut out around each of the outer cases (i.e., cut away from the rectangular plate), at a certain distance from each of them, so as to leave a certain length of lamella outside the outer case, and if desired the excess resin remaining between the lamellae is removed. Thus, a package is obtained in which an integrated circuit is encapsulated and from which external connection leads emerge.

A nitric descaling may then be carried out followed by rinsing, and the fabrication of the external connection leads is completed either by tinning or by depositing solder.

Thus, an electronic component is obtained which comprises connection leads having a thickness of less than 0.1 mm and a yield strength of greater than 1400 MPa.

Instead of forming the connection leads before implanting the silicon chips on the lead frames, it is possible to implant the silicon chips, overmold the packages, cut out the connection leads around the packages and then form, by bending, etc., the external connection leads and harden them by a localized heat treatment carried out, for example, using a laser.

For some applications, it is desirable that the structural-hardening conductive alloy be non-magnetic or of the stainless type. It is then possible to use a structural-hardening conductive alloy of the austenitic type, the chemical composition of which, by weight, comprises:

35% ≤ Co ≤ 55%
15% ≤ Cr ≤ 25%
10% ≤ Ni ≤ 35%
0% ≤ Fe ≤ 20%
0% ≤ Mo ≤ 10%
0% ≤ W ≤ 15%
0% ≤ Mn ≤ 2%
0% ≤ C ≤ 0.15% the balance being impurities resulting from the smelting.

Preferably, the chemical composition of the structural-hardening austenitic alloy is as above but such that:

39% ≤ Co ≤ 41%
15% ≤ Fe ≤ 20%
15% ≤ Ni ≤ 17%
6% ≤ Mo ≤ 8%
19% ≤ Cr ≤ 21%

With this alloy, the process is distinguished from the previous case solely by the yield strength of the alloy, which is less than 1300 MPa, before bending the connection leads and the hardening heat treatment, and greater than 1500 MPa after hardening heat treatment.

A second embodiment of the invention corresponds to a process for fabricating electronic components, in which the lead frames are arranged on tapes which allow suitable mass-scale fabrication. This process is known by the name TAB or tape automated bonding, which is generally known to those of ordinary skill in this art.

In this second embodiment, a tape is fabricated, for example by colaminating, which consists of a layer of polymer, such as a polyimide, and a layer of structural-hardening conductive alloy, as defined hereinabove. Next, for example by chemical etching, lead frames are cut out in the layer of alloy, these being arranged one behind the other. The connection leads are formed and hardened by heat treatment, as hereinabove. The connection leads may either be formed before carrying out the hardening heat treatment or the hardening heat treatment is firstly carried out and then the connection leads formed.

In a manner known per se, an electronic device, consisting of, for example, a silicon chip carrying an integrated circuit, is arranged on each of the lead frames and the internal connection leads are soldered to the electronic device. The circuits thus produced may then be automatically transferred to an electronic circuit, for example a printed circuit, using a specialized machine which cuts the external connection leads and connects them by soldering to the printed circuit.

The use of an alloy according to the invention has the advantage of allowing production of internal connection leads which are longer, by at least 15%, than those allowed by the technique according to the prior art.

Since the alloys according to the invention have very good mechanical properties, it is possible to employ the TAB process with strips consisting only of the structural-hardening conductive alloy, that is to say without the polymer layer.

With the processes according to the invention, electronic components have been fabricated which comprise a silicon chip contained in an outer casing of resin and having connection leads made of structural-hardening conductive alloy. The total thickness of the electronic components is less than 1 mm and the thickness of the connection leads is less than 0.1 mm, for example a thickness of between 0.03 mm and 0.08 mm. These electronic components for surface mounting have connection leads which are less fragile than those of the prior art.

In general, the structural-hardening conductive alloys of the invention may be used for the fabrication of discrete active components and of passive components, especially inductors, resistive networks or capacitors, for surface mounting.

This application is based on French patent application 95 05015, filed Apr. 27, 1995, incorporated herein by reference.

What is claimed as new and desired to be secured by Letters Patent of the United States is:

1. A process for fabricating an electronic component comprising a plurality of connection leads and an outer case, said connection leads extending outside said outer case, comprising the steps of:
   providing a lead frame blank comprising a structural-hardening conductive alloy, wherein said alloy has not been structurally hardened,
   forming a cutout in said blank, said cutout comprising a plate and connection leads, said leads comprising said conductive alloy,
   carrying out a secondary-hardening heat treatment on said cutout,
   fixing an electronic device on said plate and connecting it to the connection leads,
   encapsulating the device by overmolding said device and a portion of said leads closest to said device, and
   cutting the connection leads from the blank.

2. A process for fabricating an electronic component comprising a plurality of connection leads and an outer case, said connection leads extending outside said outer case, comprising the steps of:
   providing a lead frame blank comprising a structural-hardening conductive alloy, wherein said alloy has not been structurally hardened,
   forming a cutout in said blank, said cutout comprising a plate and connection leads, said leads comprising said conductive alloy,
   carrying out a secondary-hardening heat treatment on said cutout,
   fixing an electronic device on said plate and connecting it to the connection leads,
   encapsulating the device by overmolding said device and a portion of said leads closest to said device, and
   cutting the connection leads from the blank,
   wherein said structural-hardening conductive alloy comprises, by weight based on total weight:
   $0\% \leq Co \leq 30\%$
   $9\% \leq Ni \leq 21\%$
   $5\% \leq Mo \leq 12\%$
   $0.1\% \leq Al+Ti \leq 9\%$
   $0\% \leq Nb \leq 1\%$
   $0\% \leq C \leq 0.15\%$
   $0\% \leq Mn \leq 5\%$
   $0\% \leq Cr \leq 13\%$
   optionally, at least one element taken from W, V and Be each in amounts of less than 0.1% and, optionally, copper in an amount of less than 0.3%, the balance being iron and impurities resulting from smelting.

3. The process as claimed in claim 2, wherein the chemical composition of the structural-hardening conductive alloy is such that:
   $8\% \leq Co \leq 10\%$
   $17\% \leq Ni \leq 19\%$
   $5\% \leq Mo \leq 6\%$
   $0.3\% \leq Ti \leq 0.7\%$.

4. A process for fabricating an electronic component comprising a plurality of connection leads and an outer case, said connection leads extending outside said outer case, comprising the steps of:
   providing a lead frame blank comprising a structural-hardening conductive alloy, wherein said alloy has not been structurally hardened,
   forming a cutout in said blank, said cutout comprising a plate and connection leads, said leads comprising said conductive alloy,
   carrying out a secondary-hardening heat treatment on said cutout,
   fixing an electronic device on said plate and connecting it to the connection leads,
   encapsulating the device by overmolding said device and a portion of said leads closest to said device, and
   cutting the connection leads from the blank,
   wherein said structural-hardening conductive alloy comprises, by weight based on total weight:
   $35\% \leq Co \leq 55\%$
   $15\% \leq Cr \leq 25\%$
   $10\% \leq Ni \leq 35\%$
   $0\% \leq Fe \leq 20\%$
   $0\% \leq Mo \leq 10\%$
   $0\% \leq W \leq 15\%$
   $0\% \leq Mn \leq 2\%$
   $0\% \leq C \leq 0.15\%$
   the balance being impurities resulting from smelting.

5. The process as claimed in claim 4, wherein the chemical composition of the structural-hardening conductive alloy is such that:
   $39\% \leq Co \leq 41\%$
   $15\% \leq Fe \leq 20\%$ 15% ≤ Ni ≤ 17%
6% ≤ Mo ≤ 8%
19% ≤ Cr ≤ 21%.

6. The process as claimed claim 1, wherein the thickness of the connection leads is less than 0.1 mm.

7. A process for fabricating an electronic component comprising a plurality of connection leads and an outer case, said connection leads extending outside said outer case, comprising the steps of:
providing a lead frame blank comprising a structural-hardening conductive alloy, wherein said alloy has not been structurally hardened,
forming a cutout in said blank, said cutout comprising a plate and connection leads, said leads comprising said conductive alloy,
fixing an electronic device to the plate and connection leads,
encapsulating the device by overmolding said device and a portion of said leads closest to said device so as to provide external connection leads,
cutting the connection leads from the blank,
optionally forming external connection leads, and
performing a localized secondary-hardening heat treatment on the external connection leads.

8. A process for fabricating an electronic component comprising an electronic device and connection leads, comprising the steps of:
providing a strip which comprises at least one layer of structural-hardening conductive alloy of the martensitic type or of the austenitic type, before structural hardening, and, optionally, a layer of polymer,
cutting a lead frame from the strip,
either optionally forming the connection leads and carrying out a hardening heat treatment or a hardening treatment is carried out and the connection leads are optionally formed,
connecting the connection leads by soldering to the electronic device,
cutting the connection leads from the lead frame, and
optionally connecting the leads to a printed circuit.

9. A process for fabricating an electronic component comprising an electronic device and connection leads, comprising the steps of:
providing a strip which comprises at least one layer of structural-hardening conductive alloy of the austenitic type, before structural hardening, and, optionally, a layer of polymer,
cutting a lead frame from the strip,
either optionally forming the connection leads and carrying out a hardening heat treatment or a hardening treatment is carried out and the connection leads are optionally formed,
connecting the connection leads by soldering to the electronic device,
cutting the connection leads from the lead frame, and
optionally connecting the leads to a printed circuit,
wherein said structural-hardening conductive alloy comprises, by weight based on a total weight:
35% ≤ Co ≤ 55%
15% ≤ Cr ≤ 25%
10% ≤ Ni ≤ 35%
0% ≤ Fe ≤ 20%
0% ≤ Mo ≤ 10%
0% ≤ W ≤ 15%
0% ≤ Mn ≤ 2%
0% ≤ C ≤ 0.15%
the balance being impurities resulting from smelting.

10. The process as claimed in claim 9, wherein the chemical composition of the structural-hardening conductive alloy is such that:
39% ≤ Co ≤ 41%
15% ≤ Fe ≤ 20%
15% ≤ Ni ≤ 17%
6% ≤ Mo ≤ 8%
19% ≤ Cr ≤ 21%.

11. A process for fabricating an electronic component comprising an electronic device and connection leads, comprising the steps of:
providing a strip which comprises at least one layer of structural-hardening conductive alloy of the martensitic type, before structural hardening, and, optionally, a layer of polymer,
cutting a lead frame from the strip,
either optionally forming the connection leads and carrying out a hardening heat treatment or a hardening treatment is carried out and the connection leads are optionally formed,
connecting the connection leads by soldering to the electronic device,
cutting the connection leads from the lead frame, and
optionally connecting the leads to a printed circuit,
wherein said structural-hardening conductive alloy comprises, by weight based on a total weight:
0% ≤ Co ≤ 30%
9% ≤ Ni ≤ 21%
5% ≤ Mo ≤ 12%
0.1% ≤ Al+Ti ≤ 9%
0% ≤ Nb ≤ 1%
0% ≤ C ≤ 0.15%
0% ≤ Mn ≤ 5%
0% ≤ Cr ≤ 13%
optionally, at least one element taken from W, V and Be each in amounts of less than 0.1% and, optionally, copper in an amount of less than 0.3%, the balance being iron and impurities resulting from smelting.

12. The process as claimed in claim 11, wherein the chemical composition of the structural-hardening conductive alloy is such that:
8% ≤ Co ≤ 10%
17% ≤ Ni ≤ 19%
5% ≤ Mo ≤ 6%
0.3% ≤ Ti ≤ 0.7%.

13. A process for fabricating an electronic component comprising a plurality of connection leads and an outer case, said connection leads extending outside said outer case, comprising the steps of:
providing a lead frame blank comprising a structural-hardening conductive alloy,
wherein said alloy has not been structurally hardened,
forming a cutout in said blank, said cutout comprising a plate and connection leads,
said leads comprising said conductive alloy,
fixing an electronic device to the plate and connection leads,
encapsulating the device by overmolding said device and a portion of said leads closest to said device so as to provide external connection leads, cutting the connection leads from the blank, optionally forming external connection leads, and performing a localized secondary-hardening heat treatment on the external connection leads, wherein said structural-hardening conductive alloy comprises, by weight based on total weight:

0% ≤ Co ≤ 30%
9% ≤ Ni ≤ 21%
5% ≤ Mo ≤ 12%
0.1% ≤ Al+Ti ≤ 9%
0% ≤ Nb ≤ 1%
0% ≤ C ≤ 0.15%
0% ≤ Mn ≤ 5%
0% ≤ Cr ≤ 13% optionally, at least one element taken from W, V and Be each in amounts of less than 0.1% and, optionally, copper in an amount of less than 0.3%, the balance being iron and impurities resulting from smelting.

14. The process as claimed in claim 13, wherein the chemical composition of the structural-hardening conductive alloy is such that:

8% ≤ Co ≤ 10%
17% ≤ Ni ≤ 19%
5% ≤ Mo ≤ 6%
0.3% ≤ Ti ≤ 0.7%.

15. A process for fabricating an electronic component comprising a plurality of connection leads and an outer case, said connection leads extending outside said outer case, comprising the steps of:

providing a lead frame blank comprising a structural-hardening conductive alloy, wherein said alloy has not been structurally hardened, forming a cutout in said blank, said cutout comprising a plate and connection leads, said leads comprising said conductive alloy, fixing an electronic device to the plate and connection leads, encapsulating the device by overmolding said device and a portion of said leads closest to said device so as to provide external connection leads, cutting the connection leads from the blank, optionally forming external connection leads, and performing a localized secondary-hardening heat treatment on the external connection leads, wherein said structural-hardening conductive alloy comprises, by weight based on total weight:

35% ≤ Co ≤ 55%
15% ≤ Cr ≤ 25%
10% ≤ Ni ≤ 35%
0% ≤ Fe ≤ 20%
0% ≤ Mo ≤ 10%
0% ≤ W ≤ 15%
0% ≤ Mn ≤ 2%
0% ≤ C ≤ 0.15% the balance being impurities resulting from smelting.

16. The process as claimed in claim 15, wherein the chemical composition of the structural-hardening conductive alloy is such that:

39% ≤ Co ≤ 41%
15% ≤ Fe ≤ 20%
15% ≤ Ni ≤ 17%
6% ≤ Mo ≤ 8%
19% ≤ Cr ≤ 21%.

* * * * *

UNITED STATES PATENT AND TRADEMARK OFFICE
CERTIFICATE OF CORRECTION

PATENT NO. : 5,888,848
DATED : March 30, 1999
INVENTOR(S) : Ricardo COZAR, et al.

It is certified that error appears in the above-identified patent and that said Letters Patent is hereby corrected as shown below:

On the Title page, item [63] Related U.S. Application Data has been omitted. It should be:

Related U.S. Application Data

--[62] Division of Ser. No. 08/639,275, Apr. 25, 1996, Pat. No. 5,744,868.--

Signed and Sealed this

First Day of February, 2000

*Attest:*

Q. TODD DICKINSON

*Attesting Officer*  *Acting Commissioner of Patents and Trademarks*